(12) United States Patent
Cosby et al.

(10) Patent No.: US 11,474,940 B2
(45) Date of Patent: Oct. 18, 2022

(54) POWERING RANDOM ACCESS MEMORY MODULES WITH NON-VOLATILE MEMORY COMPONENTS

(71) Applicant: LENOVO ENTERPRISE SOLUTIONS (SINGAPORE) PTE. LTD., Singapore (SG)

(72) Inventors: David W. Cosby, Raleigh, NC (US); Jonathan R. Hinkle, Raleigh, NC (US); Jose M. Orro, Cary, NC (US); Theodore B. Vojnovich, Raleigh, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 367 days.

(21) Appl. No.: 16/371,082

(22) Filed: Mar. 31, 2019

(65) Prior Publication Data
US 2020/0310971 A1 Oct. 1, 2020

(51) Int. Cl.
*G06F 12/0804* (2016.01)
*G06F 1/28* (2006.01)
(52) U.S. Cl.
CPC ............ *G06F 12/0804* (2013.01); *G06F 1/28* (2013.01); *G06F 2212/1032* (2013.01)
(58) Field of Classification Search
CPC .................. G06F 1/28; G06F 12/0804; G06F 2212/1032; G06F 1/30; G06F 1/305; G06F 12/0868; G06F 2212/214; G06F 2212/311; G11C 5/04; G11C 5/143; G11C 11/005; G11C 11/4074; G11C 16/30; Y02D 10/00
See application file for complete search history.

(56) References Cited

U.S. PATENT DOCUMENTS

| 2008/0244311 | A1* | 10/2008 | Elliott | G06F 1/28 714/22 |
| 2011/0231689 | A1* | 9/2011 | Atkins | G06F 1/30 713/340 |
| 2012/0131253 | A1* | 5/2012 | McKnight | G06F 1/30 710/308 |
| 2016/0118121 | A1* | 4/2016 | Kelly | G06F 13/4068 710/301 |

* cited by examiner

*Primary Examiner* — Larry T Mackall

(57) ABSTRACT

Powering random access memory (RAM) modules with non-volatile memory components may include providing, by a power supply, a first output voltage to one or more RAM modules, each RAM module of the one or more RAM modules comprising a volatile memory component and a non-volatile memory component; providing, by the power supply, a second output voltage to one or more system components distinct from the one or more RAM modules; detecting a power event; sending, by the power supply, in response to detecting the power event, a signal to the one or more RAM modules to initiate a save operation, wherein the save operation comprises storing, for each of the one or more RAM modules, data from the volatile memory component to the non-volatile memory component; and ceasing, by the power supply, the second output voltage while maintaining the first output voltage to facilitate the save operation.

20 Claims, 5 Drawing Sheets

POWERING RANDOM ACCESS MEMORY MODULES WITH NON-VOLATILE MEMORY COMPONENTS

BACKGROUND

Field of the Invention

The field of the invention is data processing, or, more specifically, methods, apparatus, and products for powering random access memory (RAM) modules with non-volatile memory components.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Random Access Memory (RAM) modules (e.g., Non-Volatile Dual In-line Memory Modules (NVDIMMs)) may comprise volatile memory components and non-volatile memory components. The RAM modules may use the volatile memory components during normal operation due to the memory access speed advantages of volatile memory when compared to non-volatile memory. The RAM modules may store the contents of the volatile memory components to the non-volatile memory components in the event of a power event, such as a loss of system power. As the data stored in the non-volatile memory components retain their contents after power is removed, the contents of the non-volatile memory components can be used to improve crash recovery or application performance. The non-volatile memory components of the RAM modules are powered by an on-board power backup source (e.g., a battery or super-capacitor) during data transfer from the volatile memory components. These on-board power backup sources typically housed in motherboard storage slots separate from the memory sockets housing the memory components.

SUMMARY

Powering random access memory (RAM) modules with non-volatile memory components may include providing, by a power supply, a first output voltage to one or more RAM modules, each RAM module of the one or more RAM modules comprising a volatile memory component and a non-volatile memory component; providing, by the power supply, a second output voltage to one or more system components distinct from the one or more RAM modules; detecting a power event; sending, by the power supply, in response to detecting the power event, a signal to the one or more RAM modules to initiate a save operation, wherein the save operation comprises storing, for each of the one or more RAM modules, data from the volatile memory component to the non-volatile memory component; and ceasing, by the power supply, the second output voltage while maintaining the first output voltage to facilitate the save operation.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
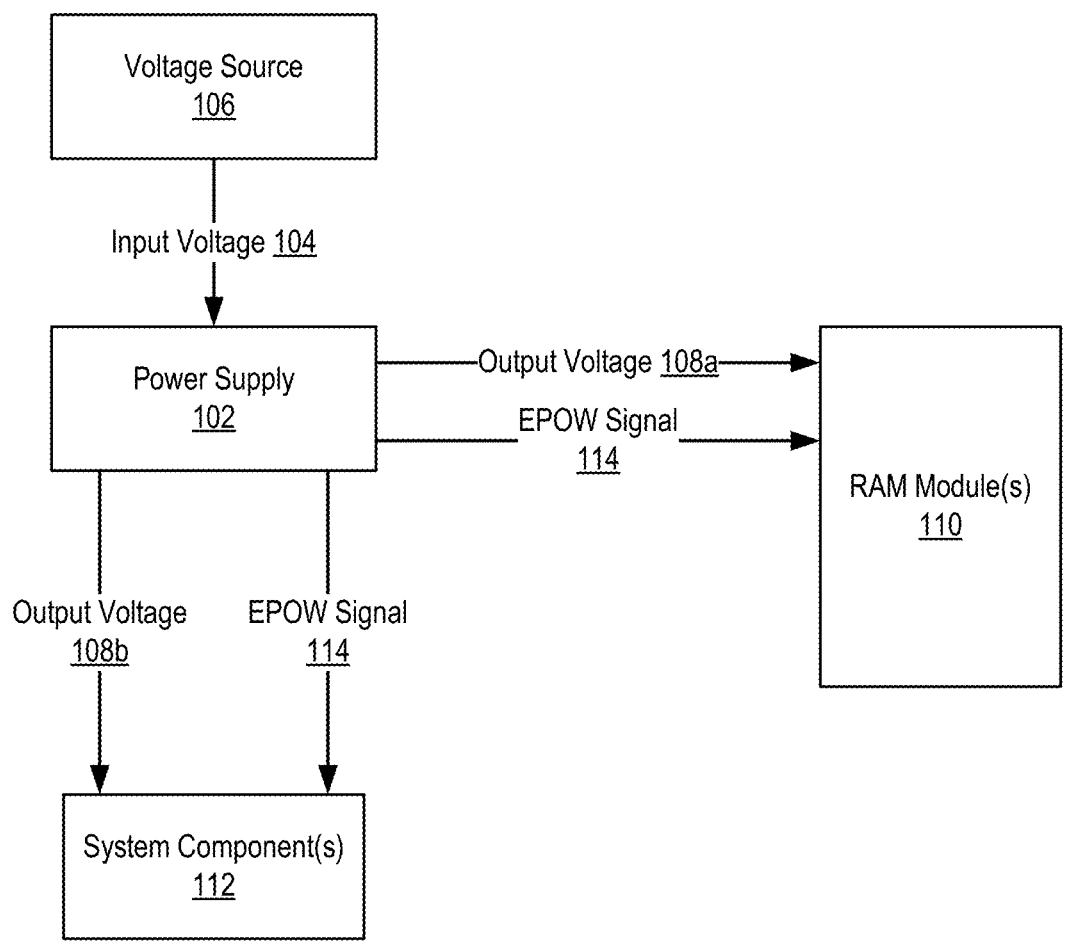
FIG. 1 is a block diagram of an example system for powering random access memory (RAM) modules with non-volatile memory components.

Exemplary methods, apparatus, and products for powering random access memory (RAM) modules with non-volatile memory components in accordance with the present invention are described with reference to the accompanying drawings, beginning with FIG. 1. FIG. 1 sets forth a block diagram of a system configured for powering random access memory (RAM) modules with non-volatile memory components according to embodiments of the present invention. The system of FIG. 1 includes a power supply 102 that receives an input voltage 104 from a voltage source 106 (e.g., a power grid, a power outlet, a battery) and converts the input voltage 104 to the frequency, voltage, and/or current of a load. For example, the power supply 102 may comprise a power supply 102 of a computer, a server, or other computing device.

The power supply 102 may be configured to provide a first output voltage 108*a* (e.g., 12 volts, or another voltage) to one or more Random Access Memory (RAM) modules 110. The RAM modules 110 may comprise both volatile memory components and non-volatile memory components. The volatile memory components of the RAM modules 110 do not retain their contents in the event of a power loss, while the non-volatile memory components retain their contents in the event of a power loss. For example, the RAM modules 110 may comprise Non-Volatile Dual In-line Memory Modules (NVDIMMs) (e.g., NVDIMM-F, NVDIMM-N, NVDIMM-P, NVDIMM-X). Providing the first output voltage 108*a* to the RAM modules 110 may comprise providing the first output voltage 108*a* via a line routed to a pin of one or more sockets (e.g., memory sockets) housing the RAM modules 110.

The power supply 102 may also be configured to provide, concurrent to the first output voltage 108*a*, a second output voltage 108*b* to one or more other system components 112. The second output voltage 108*b* may be provided by one or more lines, wires, or connectors separate from those used to provide the first output voltage 108*a*. For example, the second output voltage 108b may be provided to a motherboard, peripheral card (e.g., video card, sound cart), network adapter, Input/Output (IO) adapter, disk drives, data storage drives, or other components of a computing device.

The power supply 102 may detect a power event. A power event may comprise a loss of input voltage 104. A power event may also comprise the input voltage 104 falling below a threshold. In response to the power event, the power supply 102 may send an Emergency Power Off Warning (EPOW) signal 114 to the RAM modules 110. The power supply 110 may also send the EPOW signal 114 to the system components 112. The power supply 102 may determine if the power event has ended within a ride-though time associated with the power supply 102. The ride-through time of the power supply 102 is a time during which the power supply 102 can continue to provide the output voltages 108a/b (e.g., from capacitors and/or supercapacitors in the power supply 102) during a power event.

If the power event ends within the ride-though time (e.g., the input voltage 104 is restored), then the power supply 102 will continue to provide the output voltages 108a/b and refrain from sending the EPOW signal 114. Otherwise, if the power event does not end within the ride-through time, the power supply 102 may send the EPOW signal 114 to the system components 112 and/or RAM modules 110. One skilled in the art would appreciate that sending the EPOW signal 114 to the system components 112 may cause the system components 112 to perform one or more operations to prevent data loss or component damage in the event of a power loss (e.g., spinning down drives, shutting down functions or applications, etc.)

Sending the EPOW signal 114 to the RAM modules 110 may initiate a save operation that stores, into the non-volatile memory components of the RAM modules 110, data stored in the volatile memory components of the RAM modules 110. Thus, the data can later be retrieved from the non-volatile memory components to assist in crash recovery and preserve data integrity.

To facilitate the save operation, the power supply 102 may cease providing the second output voltage 108b while maintaining the first output voltage 108a. Thus, the RAM modules 110 will have the necessary power to perform the save operation, and the power reserves of the power supply 102 (e.g., capacitors, supercapacitors) are not drained by the first output voltage 108b. As the RAM modules 110 are powered directly from the power supply 102 during the save operation, the RAM modules 110 need not include the dedicated power sources (e.g., batteries or supercapacitors) found in current RAM modules 110 with volatile and non-volatile memory components (e.g., NVDIMMs). This reduces the overall production costs associated with the RAM modules 110 compared to current implementations. As current implementations require that storage slots (e.g., motherboard storage slots) be used to house the dedicated power sources of the RAM modules 110, this approach frees the storage slots for other uses.

The power supply 102 may cease providing the output voltage 108b after a predefined time period has passed. The predefined time period may be relative to a time at which the power event has occurred. The predefined time period may also be relative to a time at which the EPOW signal 114 was sent. By continuing to provide the output voltage 108b for the predefined amount of time, the system components 112 are afforded time to perform operations specified to be performed in the event that an EPOW signal 114 is received.

Powering random access memory (RAM) modules with non-volatile memory components in accordance with the present invention is generally implemented with computers, that is, with automated computing machinery. For further explanation, therefore, FIG. 2 sets forth a block diagram of automated computing machinery comprising an exemplary computing device 200 configured for powering random access memory (RAM) modules with non-volatile memory components according to embodiments of the present invention. For example, the power supply 102 of FIG. 1 may be housed within or serve as a component of the computing device 200. The computing device 200 of FIG. 2 includes at least one computer processor 202 or 'CPU' as well as random access memory 204 ('RAM') which is connected through a high speed memory bus 206 and bus adapter 208 to processor 202 and to other components of the computing device 200. For example, the RAM 204 may comprise one or more RAM modules 110 of FIG. 1. Accordingly, the RAM 204 may be configured to receive an output voltage 108a (see FIG. 1) from the power supply 102.

Stored in RAM 204 is an operating system 210. Operating systems useful in computers configured for powering random access memory (RAM) modules with non-volatile memory components according to embodiments of the present invention include UNIX™, Linux™, Microsoft Windows™, AIX™, IBM's i OS™, and others as will occur to those of skill in the art. The operating system 210 in the example of FIG. 2 is shown in RAM 204, but many components of such software typically are stored in non-volatile memory also, such as, for example, on data storage 212, such as a disk drive.

Figure 2:
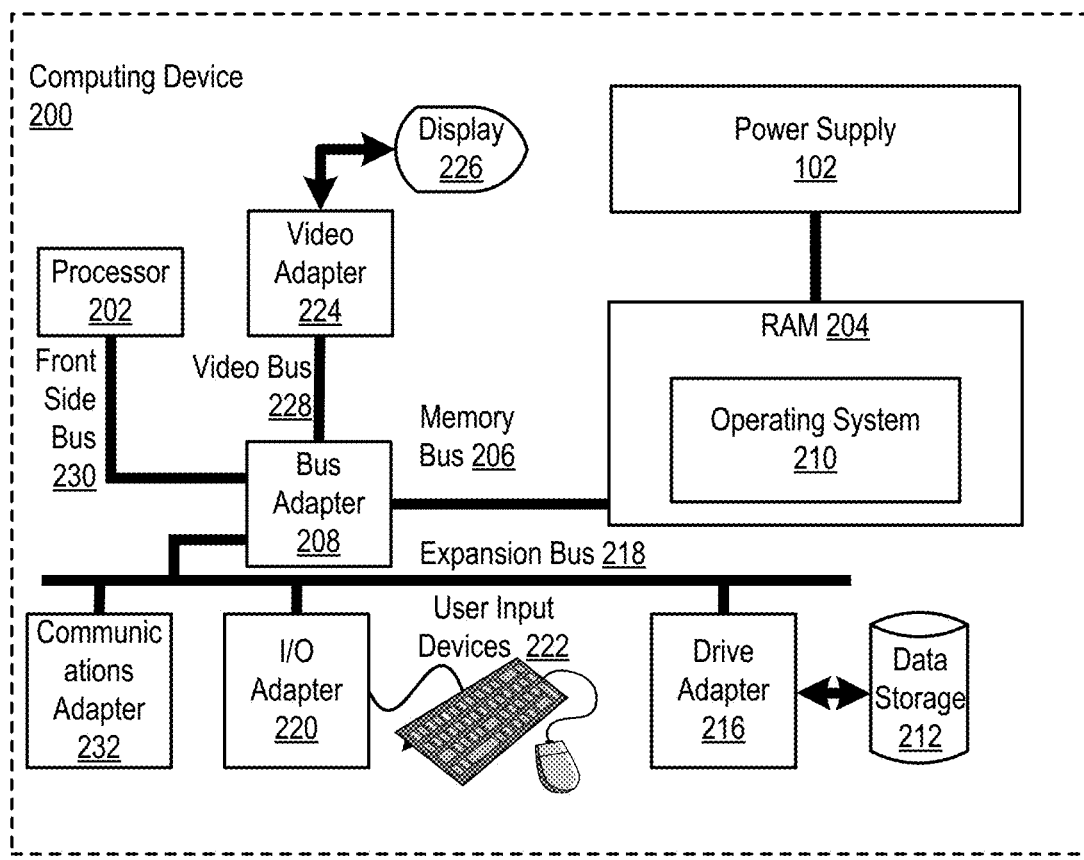
FIG. 2 is a block diagram of an example computing device for powering random access memory (RAM) modules with non-volatile memory components.

The computing device 200 of FIG. 2 includes disk drive adapter 216 coupled through expansion bus 218 and bus adapter 208 to processor 202 and other components of the computing device 200. Disk drive adapter 216 connects non-volatile data storage to the computing device 200 in the form of data storage 212. Disk drive adapters useful in computers configured for powering random access memory (RAM) modules with non-volatile memory components according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computing device 200 of FIG. 2 includes one or more input/output ('I/O') adapters 220. I/O adapters implement user-oriented input/output through, for example, software drivers and computer hardware for controlling output to display devices such as computer display screens, as well as user input from user input devices 222 such as keyboards and mice. The example computing device 200 of FIG. 2 includes a video adapter 224, which is an example of an I/O adapter specially designed for graphic output to a display device 226 such as a display screen or computer monitor. Video adapter 224 is connected to processor 202 through a high speed video bus 228, bus adapter 208, and the front side bus 230, which is also a high speed bus.

The exemplary computing device 200 of FIG. 2 includes a communications adapter 232 for data communications with other computers and for data communications with a data communications network. Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for powering random access memory (RAM) modules with non-volatile memory components according to embodiments of the present invention include modems for wired dial-up communications, Ethernet (IEEE 802.3) adapters for wired data communications, and 802.11 adapters for wireless data communications.

Figure 3:
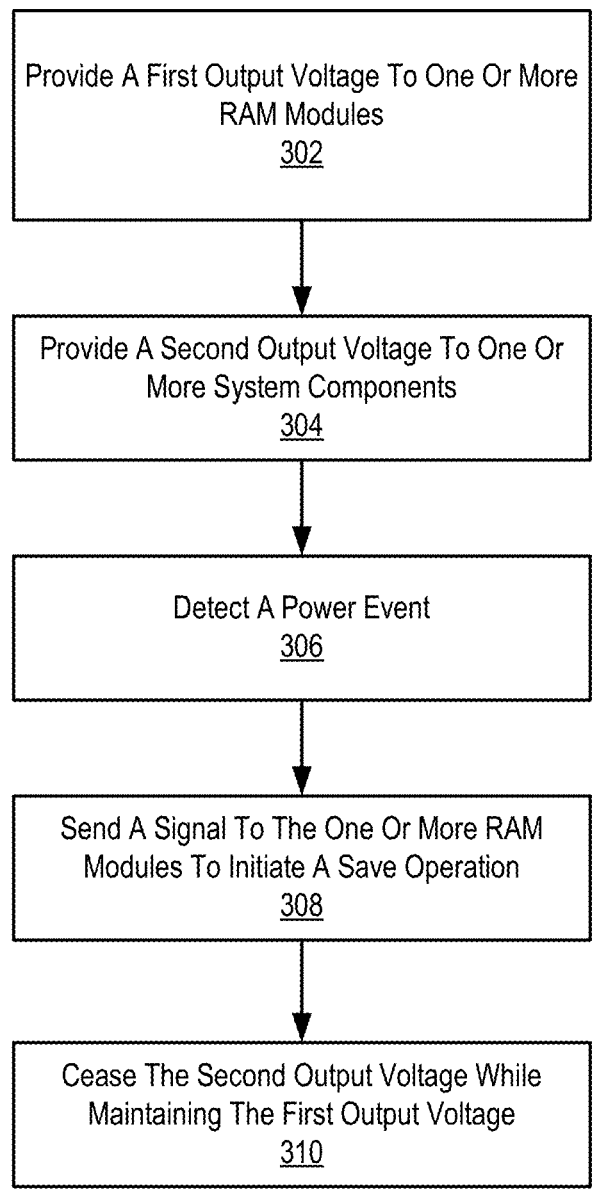
FIG. 3 is a flowchart of an example method for powering random access memory (RAM) modules with non-volatile memory components.

For further explanation, FIG. 3 sets forth a flow chart illustrating an exemplary method for powering random access memory (RAM) modules with non-volatile memory components according to embodiments of the present invention that includes providing 302, by a power supply 102, a first voltage output 108a to one or more RAM modules 110. The RAM modules 110 may comprise both volatile memory components and non-volatile memory components. The volatile memory components of the RAM modules 110 do not retain their contents in the event of a power loss, while the non-volatile memory components retain their contents in the event of a power loss. For example, the RAM modules 110 may comprise Non-Volatile Dual In-line Memory Modules (NVDIMMs) (e.g., NVDIMM-F, NVDIMM-N, NVDIMM-P, NVDIMM-X). Providing the first output voltage 108a to the RAM modules 110 may comprise providing the first output voltage 108a via a line routed to a pin of one or more sockets (e.g., memory sockets) housing the RAM modules 110.

The method of FIG. 3 may further comprise providing 304, by the power supply 102, a second output voltage 108b to one or more other system components 112. The second output voltage 108b may be provided by one or more lines, wires, or connectors separate from those used to provide the first output voltage 108a. For example, the second output voltage 108b may be provided to a motherboard, peripheral card (e.g., video card, sound cart), network adapter, Input/Output (IO) adapter, disk drives, data storage drives, or other components of a computing device.

The method of FIG. 3 may further comprise detecting 306 a power event. A power event may comprise a loss of input voltage 104. A power event may also comprise the input voltage 104 falling below a threshold. The method of FIG. 3 may further comprise sending 308 a signal (e.g., an Emergency Power Off Warning (EPOW) signal 114) to the RAM modules 110 to initiate a save operation. The save operation may store, into the non-volatile memory components of the RAM modules 110, data stored in the volatile memory components of the RAM modules 110. Thus, the data can later be retrieved from the non-volatile memory components to assist in crash recovery and preserve data integrity.

The method of claim 3 may further comprise ceasing 310 the second output voltage 108b while maintaining the first output voltage 108a. Thus, the RAM modules 110 will have the necessary power to perform the save operation, and the power reserves of the power supply 102 (e.g., capacitors, supercapacitors) are not drained by the first output voltage 108b. As the RAM modules 110 are powered directly from the power supply 102 during the save operation, the RAM modules 110 need not include the dedicated power sources (e.g., batteries or supercapacitors) found in current RAM modules 110 with volatile and non-volatile memory components (e.g., NVDIMMs). This reduces the overall production costs associated with the RAM modules 110 compared to current implementations. As current implementations require that storage slots (e.g., motherboard storage slots) be used to house the dedicated power sources of the RAM modules 110, this approach frees the storage slots for other uses.

Figure 4:
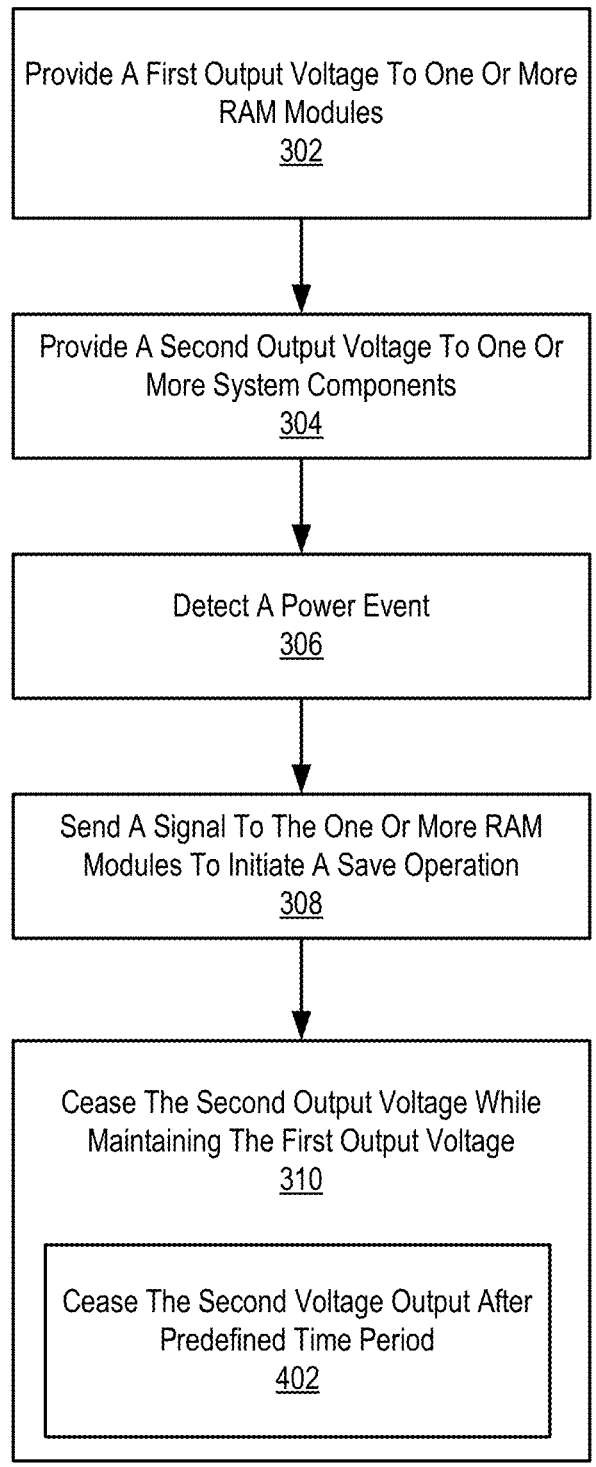
FIG. 4 is a flowchart of an example method for powering random access memory (RAM) modules with non-volatile memory components.

For further explanation, FIG. 4 sets forth a flow chart illustrating a further exemplary method for powering random access memory (RAM) modules with non-volatile memory components according to embodiments of the present invention that includes providing 302, by a power supply 102, a first output voltage 108a to one or more RAM modules 110, providing 304 a second output voltage 108b to one or more system components 112, detecting 306 a power event, sending 308 a signal to the one or more RAM modules 110 to initiate a save operation, and ceasing 310 the second output voltage 108b while maintaining the first output voltage 108a.

FIG. 4 differs from FIG. 3 in that the ceasing 310 the second output voltage 108b while maintaining the first output voltage 108a comprises ceasing 402 the output voltage 108b after a predefined time period has passed. The predefined time period may be relative to a time at which the power event has occurred. The predefined time period may also be relative to a time at which the EPOW signal 114 was sent. By continuing to provide the output voltage 108b for the predefined amount of time, the system components 112 are afforded time to perform operations specified to be performed in the event that an EPOW signal 114 is received.

Figure 5:
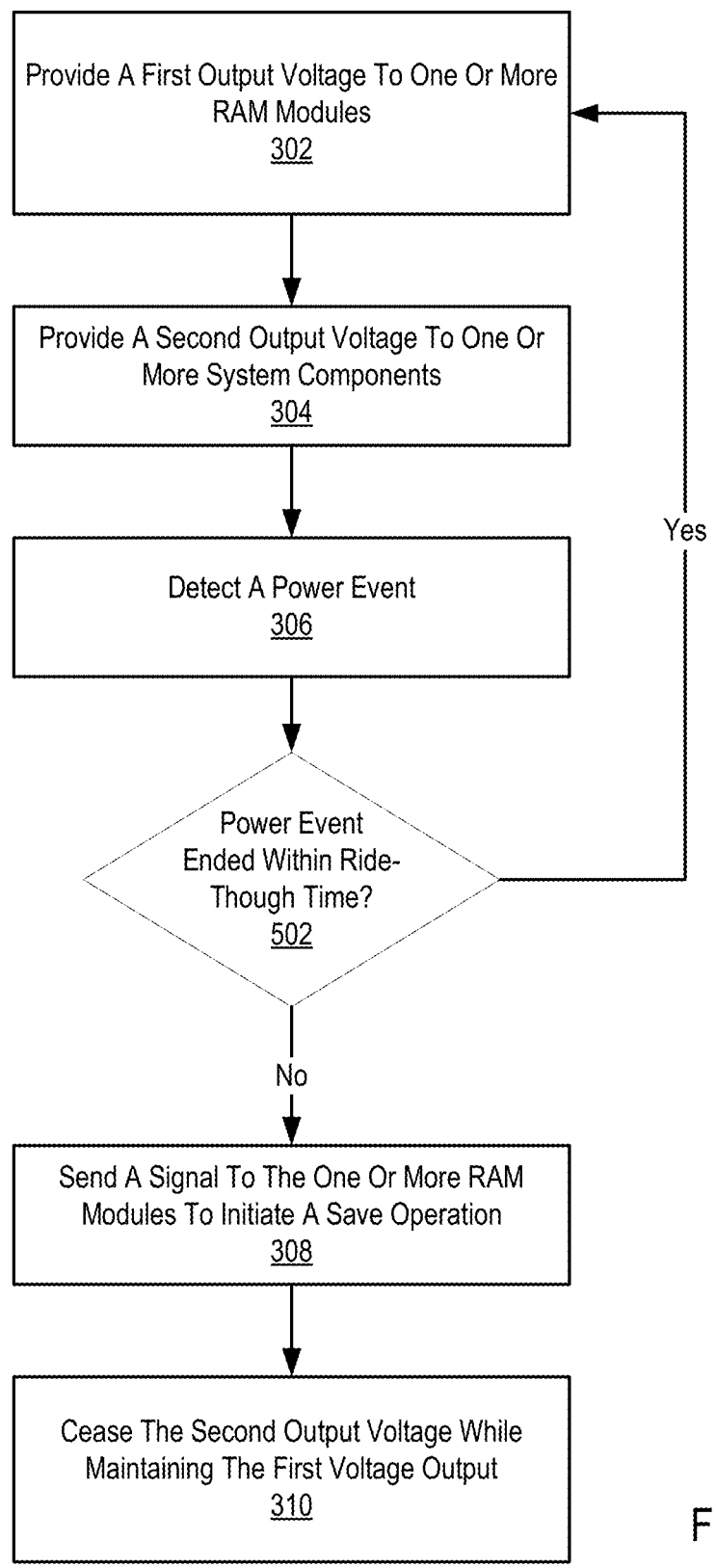
FIG. 5 is a flowchart of an example method for powering random access memory (RAM) modules with non-volatile memory components.

For further explanation, FIG. 5 sets forth a flow chart illustrating a further exemplary method for powering random access memory (RAM) modules with non-volatile memory components according to embodiments of the present invention that includes providing 302, by a power supply 102, a first output voltage 108a to one or more RAM modules 110, providing 304 a second output voltage 108b to one or more system components 112, detecting 306 a power event, sending 308 a signal to the one or more RAM modules 110 to initiate a save operation, and ceasing 310 the second output voltage 108b while maintaining the first output voltage 108a.

FIG. 5 differs from FIG. 3 in that the method of FIG. 5 further comprises determining 502 if the power event has ended within a ride-though time associated with the power supply 102. The ride-through time of the power supply 102 is a time during which the power supply 102 can continue to provide the output voltages 108a/b (e.g., from capacitors and/or supercapacitors in the power supply 102) during a power event.

If the power event ends within the ride-though time (e.g., the input voltage 104 is restored), method of FIG. 5 returns to providing 302 the first output voltage 108a. Otherwise, if the power event does not end within the ride-through time, the method of FIG. 5 proceeds to sending 308 the signal to the one or more RAM modules 308 to initiate the save operation.

In view of the explanations set forth above, readers will recognize that the benefits of powering random access memory (RAM) modules with non-volatile memory components according to embodiments of the present invention include:

Reduced production costs of RAM modules with non-volatile memory components when compared to existing modules that require dedicated power sources (e.g., batteries or super capacitors) to power the non-volatile memory components during the save operation.

Storage slots of a computer that would be used to house dedicated power sources (e.g., batteries or super capacitors) to power the non-volatile memory components are freed and able to be used by additional components.

Exemplary embodiments of the present invention are described largely in the context of a fully functional computer system powering random access memory (RAM) modules with non-volatile memory components. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of powering random access memory (RAM) modules with non-volatile memory components, the method comprising:
   providing, by a power supply, a first output voltage to one or more RAM modules, each RAM module of the one or more RAM modules comprising a volatile memory component and a non-volatile memory component;
   providing, by the power supply, a second output voltage to one or more system components distinct from the one or more RAM modules;
   detecting a power event;
   sending, by the power supply, in response to detecting the power event, a signal to the one or more RAM modules to initiate a save operation, wherein the save operation comprises storing, for each of the one or more RAM modules, data from the volatile memory component to the non-volatile memory component; and
   ceasing, by the power supply, the second output voltage while continuing to provide, by the power supply the first output voltage directly to the RAM modules to facilitate the save operation.

2. The method of claim 1, wherein ceasing the second output voltage while maintaining the first output voltage comprises ceasing the second output voltage after a predefined time period.

3. The method of claim 2, wherein the predefined time period is relative to a time at which the power event was detected or a time at which the signal was sent.

4. The method of claim 1, further comprising sending the signal to the one or more system components.

5. The method of claim 1, wherein the power event comprises a loss of input power to the power supply and/or the input power falling below a threshold.

6. The method of claim 1, further comprising:
   determining that the power event has not ended within a ride-through time of the power supply,
   wherein sending the signal to the one or more RAM modules comprises sending the signal in response to the power event not ending within the ride-though time.

7. The method of claim 1, wherein the signal comprises an Emergency Power Off Warning signal.

8. A power supply for powering random access memory (RAM) modules with non-volatile memory components, the power supply configured to perform steps comprising:
   providing a first output voltage to one or more RAM modules, each RAM module of the one or more RAM modules comprising a volatile memory component and a non-volatile memory component;
   providing a second output voltage to one or more system components distinct from the one or more RAM modules;
   detecting a power event;
   sending, in response to detecting the power event, a signal to the one or more RAM modules to initiate a save operation, wherein the save operation comprises storing, for each of the one or more RAM modules, data from the volatile memory component to the non-volatile memory component; and
   ceasing, by the power supply, the second output voltage while continuing to provide, by the power supply the first output voltage directly to the RAM modules to facilitate the save operation.

9. The power supply of claim 8, wherein ceasing the second output voltage while maintaining the first output voltage comprises ceasing the second output voltage after a predefined time period.

10. The power supply of claim 9, wherein the predefined time period is relative to a time at which the power event was detected or a time at which the signal was sent.

11. The power supply of claim 8, wherein the steps further comprise sending the signal to the one or more system components.

12. The power supply of claim 8, wherein the power event comprises one or more of a loss of input power to the power supply or the input power falling below a threshold.

13. The power supply of claim 8, wherein the steps further comprise:
   determining that the power event has not ended within a ride-through time of the power supply,
   wherein sending the signal to the one or more RAM modules comprises sending the signal in response to the power event not ending within the ride-though time.

14. The power supply of claim 8, wherein the signal comprises an Emergency Power Off Warning signal.

15. An apparatus comprising:
   a power supply for powering random access memory (RAM) modules with non-volatile memory components, the power supply configured to carry out the steps of:
      providing a first output voltage to one or more RAM modules, each RAM module of the one or more RAM modules comprising a volatile memory component and a non-volatile memory component;
      providing a second output voltage to one or more system components distinct from the one or more RAM modules;
      detecting a power event;
      sending, in response to detecting the power event, a signal to the one or more RAM modules to initiate a save operation, wherein the save operation comprises storing, for each of the one or more RAM modules, data from the volatile memory component to the non-volatile memory component; and
      ceasing, by the power supply, the second output voltage while continuing to provide, by the power supply the first output voltage directly to the RAM modules to facilitate the save operation.

16. The apparatus of claim 15, wherein ceasing the second output voltage while maintaining the first output voltage comprises ceasing the second output voltage after a predefined time period.

17. The apparatus of claim 16, wherein the predefined time period is relative to a time at which the power event was detected or a time at which the signal was sent.

18. The apparatus of claim 15, wherein the steps further comprise sending the signal to the one or more system components.

19. The apparatus of claim 15, wherein the power event comprises a loss of input power to the power supply and/or the input power falling below a threshold.

20. The apparatus of claim 15, wherein the steps further comprise:
   determining that the power event has not ended within a ride-through time of the power supply,
   wherein sending the signal to the one or more RAM modules comprises sending the signal in response to the power event not ending within the ride-though time.

* * * * *